US009471488B2

(12) United States Patent
Wakchaure et al.

(10) Patent No.: US 9,471,488 B2
(45) Date of Patent: Oct. 18, 2016

(54) TECHNIQUES FOR IMPROVING RELIABILITY AND PERFORMANCE OF PARTIALLY WRITTEN MEMORY BLOCKS IN MODERN FLASH MEMORY SYSTEMS

(71) Applicant: Intel Corporation, Santa Clara, CA (US)

(72) Inventors: Yogesh B. Wakchaure, Folsom, CA (US); Aliasgar S. Madraswala, Folsom, CA (US); Kristopher H. Gaewsky, El Dorado Hills, CA (US); Charan Srinivasan, Redwood City, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/961,424

(22) Filed: Dec. 7, 2015

(65) Prior Publication Data

US 2016/0085668 A1 Mar. 24, 2016

Related U.S. Application Data

(62) Division of application No. 14/318,572, filed on Jun. 27, 2014, now Pat. No. 9,208,888.

(51) Int. Cl.
*G11C 16/04* (2006.01)
*G11C 16/34* (2006.01)
(Continued)

(52) U.S. Cl.
CPC ........... *G06F 12/0246* (2013.01); *G11C 16/08* (2013.01); *G11C 16/10* (2013.01); *G11C 16/14* (2013.01); *G11C 16/26* (2013.01); *G11C 16/30* (2013.01); *G06F 2212/7201* (2013.01);
(Continued)

(58) Field of Classification Search
CPC .......... G11C 16/10; G11C 2211/5648; G11C 16/0483; G11C 16/34
USPC ........................ 365/185.12, 185.18, 185.24
See application file for complete search history.

(56) References Cited

U.S. PATENT DOCUMENTS 7,017,004 B1 3/2006 Calligaro et al.
8,213,236 B1 7/2012 Wu et al.
(Continued)

FOREIGN PATENT DOCUMENTS

WO 2013/101043 A1 7/2013
WO 2015/048125 A1 4/2015

OTHER PUBLICATIONS

International Search Report and Written Opinion received for International Application No. PCT/US2014/057204, mailed on Dec. 19, 2014.
(Continued)

*Primary Examiner* — Ly D Pham
(74) *Attorney, Agent, or Firm* — Alpine Technology Law Group LLC

(57) ABSTRACT

Methods and apparatus to improve reliability and/or performance of partially written memory blocks in flash memory systems are described. In some embodiments, a storage device stores information corresponding to a partial write operation performed on a partially programmed memory block of a non-volatile memory. Memory controller logic then cause application of a reduced voltage level and/or an offset value to portion(s) of the non-volatile memory during a read or write operation to the non-volatile memory based at least in part on the stored information. Other embodiments are also disclosed and claimed.

20 Claims, 7 Drawing Sheets

(51) Int. Cl.
*G11C 16/10* (2006.01)
*G06F 12/02* (2006.01)
*G11C 16/26* (2006.01)
*G11C 16/30* (2006.01)
*G11C 16/08* (2006.01)
*G11C 16/14* (2006.01)
*G11C 5/14* (2006.01)
*G11C 11/16* (2006.01)
*G11C 11/56* (2006.01)
*G11C 13/00* (2006.01)

(52) U.S. Cl.
CPC ............ *G11C5/147* (2013.01); *G11C 11/1673* (2013.01); *G11C 11/5642* (2013.01); *G11C 13/0059* (2013.01); *G11C 16/0483* (2013.01); *G11C 16/34* (2013.01); *G11C 2211/5648* (2013.01)

(56) References Cited

U.S. PATENT DOCUMENTS

| | | | |
|---|---|---|---|
| 8,289,787 B2 | 10/2012 | Kim et al. | |
| 8,717,821 B2 | 5/2014 | Jung et al. | |
| 8,934,284 B2 | 1/2015 | Patapoutian et al. | |
| 2008/0109612 A1 | 5/2008 | Jones | |
| 2008/0117688 A1 | 5/2008 | Park et al. | |
| 2008/0239812 A1* | 10/2008 | Abiko | G11C 11/5628 365/185.12 |
| 2008/0247240 A1 | 10/2008 | Lee | |
| 2008/0266978 A1* | 10/2008 | Goda | G11C 11/5628 365/185.26 |
| 2008/0298133 A1 | 12/2008 | Kim et al. | |
| 2008/0316820 A1 | 12/2008 | Soel et al. | |
| 2009/0296465 A1 | 12/2009 | Wang et al. | |
| 2010/0110793 A1 | 5/2010 | Kim et al. | |
| 2010/0110815 A1 | 5/2010 | Lee et al. | |
| 2011/0267905 A1 | 11/2011 | Kim et al. | |
| 2012/0163092 A1 | 6/2012 | Jung et al. | |
| 2012/0176843 A1* | 7/2012 | Kalavade | G11C 11/5628 365/185.19 |
| 2014/0082460 A1 | 3/2014 | Pangal et al. | |
| 2014/0241032 A1 | 8/2014 | Patapoutian et al. | |
| 2015/0187413 A1 | 7/2015 | Patapoutian et al. | |

OTHER PUBLICATIONS

Non-Final Office Action received for U.S. Appl. No. 14/040,239, issued on May 1, 2015, 20 pages.

International Preliminary Report on Patentability and Written Opinion received for PCT Patent Application No. PCT/US2011/067810, mailed on Jul. 10, 2014, 7 pages.

International Search Report and Written Opinion received for PCT Application No. PCT/US2011/067810, mailed on Sep. 24, 2012, 11 pages.

Non-Final Office Action received for U.S. Appl. No. 13/997,212, mailed on Aug. 26, 2015, 17 pages.

Final Office Action received for U.S. Appl. No. 14/040,239, mailed on Nov. 19, 2015, 16 pages.

* cited by examiner ical movement generates heat and increases power consumption. Also, flash drives are much faster when performing read and write operations when compared with hard drives. To this end, many computing segments are migrating towards flash memory devices that are non-volatile.

TECHNIQUES FOR IMPROVING RELIABILITY AND PERFORMANCE OF PARTIALLY WRITTEN MEMORY BLOCKS IN MODERN FLASH MEMORY SYSTEMS

FIELD

The present disclosure generally relates to the field of electronics. More particularly, some embodiments generally relate to techniques for improving reliability and/or performance of partially written memory blocks in flash memory systems.

BACKGROUND

Generally, memory used to store data in a computing system can be volatile (to store volatile information) or non-volatile (to store persistent information). Volatile data structures stored in volatile memory are generally used for temporary or intermediate information that is required to support the functionality of a program during the run-time of the program. On the other hand, persistent data structures stored in non-volatile memory are available beyond the run-time of a program and can be reused. Moreover, new data is typically generated as volatile data first, before the user or programmer decides to make the data persistent. For example, programmers or users may cause mapping (i.e., instantiating) of volatile structures in volatile main memory that is directly accessible by a processor. Persistent data structures, on the other hand, are instantiated on non-volatile storage devices like rotating disks attached to Input/Output (I/O or IO) buses or non-volatile memory based devices like flash memory.

As computing capabilities are enhanced in processors, one concern is the speed at which memory may be accessed by a processor. For example, to process data, a processor may need to first fetch data from a memory. After completion of the data processing, the results may need to be stored in the memory. Therefore, the memory access speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices as excess power consumption may increase costs (e.g., due to additional power usage, increased cooling requirements, etc.), shorten component life, limit locations at which a device may be used, etc.

Hard disk drives provide a relatively low-cost storage solution and are used in many computing devices to provide non-volatile storage. Disk drives however use a lot of power when compared to solid state drives (including non-volatile memory such as flash memory) since a disk drive needs to spin its disks at a relatively high speed and move disk heads relative to the spinning disks to read/write data. This physical movement generates heat and increases power consumption. Also, flash drives are much faster when performing read and write operations when compared with hard drives. To this end, many computing segments are migrating towards flash memory devices that are non-volatile.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

As discussed above, many computing segments are migrating towards flash memory devices that are non-volatile. NAND memory is one type of flash memory that is non-volatile. NAND memory may be used in memory cards, flash drives, Solid State Drives (SSDs), and similar products. In Solid State Drive (SSD) usage models, the system could be writing to multiple memory blocks at a given time and NAND memory die as a result may have more than one block in the partially written state. The partial writing may however cause one or more issues. First, partially programmed/written blocks may pose higher reliability risk (when compared to fully written blocks). Second, some performance techniques, such as Dynamic Word Line Start Voltage (DWLSV), may not be utilized.

To this end, some embodiments improve reliability and/or performance of partially written memory blocks (also referred to as memory "bands") in flash memory systems, such as partially programmed NAND blocks in a Solid State Drive (SSD). While NAND memory is generally discussed herein, embodiments are not limited to NAND memory and may be applicable to other types of flash memory (such as NOR flash memory). In some embodiments, a storage device stores information corresponding to a partial write operation performed on a partially programmed memory block of a flash memory. Memory controller logic then cause application of a reduced voltage level and/or an offset value to portion(s) of the flash memory during a read or write operation to the flash memory based at least in part on the stored information. Accordingly, such techniques may be used to provide consistent SSD performance, even for read intensive corner case workloads.

Figure 1:
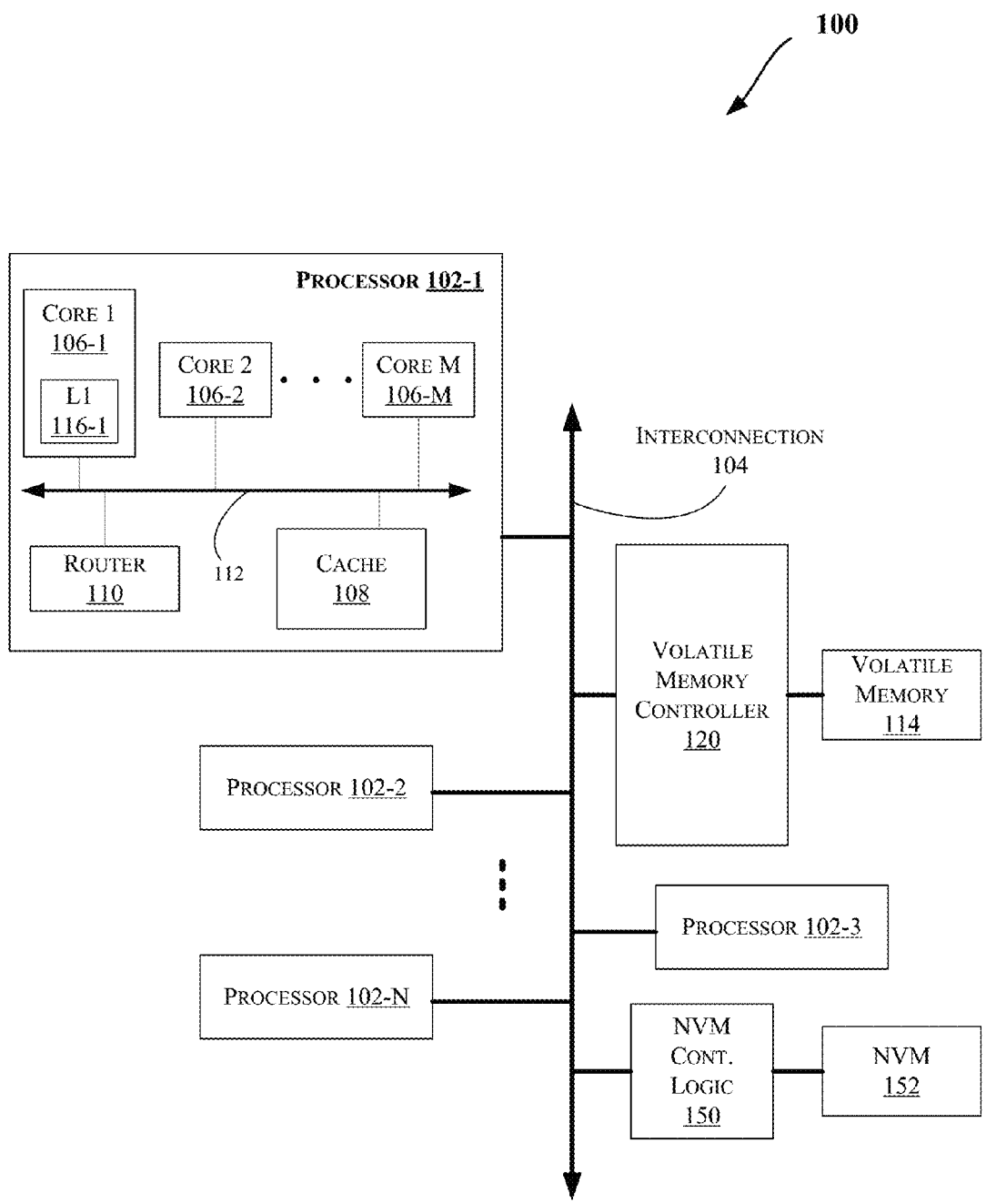
FIGS. 1, 5, 6, and 7 illustrate block diagrams of embodiments of computing systems, which may be utilized to implement various embodiments discussed herein.

Moreover, the techniques discussed herein may be provided in various computing systems (e.g., including a mobile device such as a smartphone, tablet, UMPC (Ultra-Mobile Personal Computer), laptop computer, Ultrabook™ computing device, smart watch, smart glasses, etc.), such as those discussed with reference to FIGS. 1-7. More particularly, FIG. 1 illustrates a block diagram of a computing system 100, according to an embodiment. The system 100 includes one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 120, logic 150, memory controllers (such as those discussed with reference to FIGS. 5-7), NVM (Non-Volatile Memory) 152 (e.g., including flash memory, an SSD (with NAND memory cells)), etc., or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a volatile memory 114 for faster access by the components of the processor 102. As shown in FIG. 1, the memory 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory 114 may be coupled to other components of system 100 through a volatile memory controller 120. System 100 also includes NVM memory controller logic 150 to couple NVM memory 152 to various components of the system 100. Memory 152 includes non-volatile memory such as flash memory, Spin Torque Transfer Random Access Memory (STTRAM), Resistive Random Access Memory, 3D Cross Point Memory such as PCM (Phase Change Memory), an SSD with NAND memory, etc. in some embodiments. Even though the memory controller 150 is shown to be coupled between the interconnection 104 and the memory 152, the logic 150 may be located elsewhere in system 100. For example, logic 150 (or portions of it) may be provided within one of the processors 102, controller 120, etc. in various embodiments. In an embodiment, logic 150 and NVM 152 are included in an SSD. Moreover, logic 150 controls access to one or more NVM devices 152 (e.g., where the one or more NVM devices are provided on the same integrated circuit die in some embodiments), as discussed herein with respect to various embodiments.

As discussed above, there are generally two issues when memory blocks are partially written. First, partially programmed blocks may pose some higher reliability risks (compared to fully written blocks) and one of the risks is a Read Disturb (RD) risk. More particularly, when reading a partially written block, higher wordline (WL) voltage is applied on the erased wordlines as user does not have knowledge of how many wordlines are written on that block. This causes disturb (equivalent to slow programming) on these erased wordlines and increases RBER (Raw Bit Error Rate, which refers to the fraction of data bits failing during a NAND read operation) on these erased wordlines. Moreover, RD risk is higher on partially programmed blocks since RD plus FGFG (Floating Gate to Floating Gate—the capacitive coupling from charge on neighboring flash cells) coupling is worse than FGFG plus RD (e.g., because RD mechanism follows Fowler-Nordheim (FN) tunneling and it reaches the same final Vt (threshold voltage) irrespective of the initial Vt).

One current solution is to relocate (copy from the original location, write to a new location, and then erase the original location) the partially written block after total read count on that block crosses a threshold. This threshold value is generally much lower (sometimes by order of about 10) for partially written bands and thus may trigger a lot of block relocation in read intensive workloads. This in turn results in drive performance drop for such read intensive workloads.

A second issue with partially written memory blocks is applying Dynamic Word Line Start Voltage (DWLSV) for Lower Page (LP) programming. Some current implementations may store the first lower page program loop count in one of the NAND locations/registers and may use that information to derive program start voltage for subsequent lower page programs. However, this scheme only works when NAND is programming one memory block at a time but fails when NAND is programming more than one block in parallel. In most solid state drives, the system can program multiple blocks in parallel, so dynamic lower page start voltage scheme will not work in those systems. Accordingly, even though DWLSV (also sometimes referred to herein as WLSV or Word Line Start Voltage) scheme may generally provide about 8-10% improvement in the block program time, is unusable with some current SSD architectures.

To address these issues, some embodiments store a list of partially programmed blocks on the NAND die and also for each block number stores the corresponding last wordline programmed and LP WLSV loop count information (e.g., on NVM 152). Further, logic coupled to the NAND die (e.g., logic 150 of FIG. 1 or other logic) may compare the incoming command (read/write command) block number to the list of blocks stored on the NAND die and take appropriate action (e.g., apply appropriate voltage setting, bias scheme, etc.) based on the match or comparison. In an embodiment, the NAND device stores the partially programmed block list on the NAND die and also stores corresponding last word line programmed and LP WLSV information.

Table 1 below shows one sample profile storage location that stores the partially programmed block information on the NAND die as discussed above (e.g., on NVM 152). Sample parameters are marked with p1, p2, p3, and p4. Also, while the sample profile illustrates an 8-bit profile (marked with 0 to 7 in the table below), other number of bits may also be used, depending on the implementation. In table 1, "wl" refers to wordline, "blk address" refers to block address, "sub" refers to sub block, and "loc" refers to location.

TABLE 1

| param | 7 | 6 | 5 | 4 | 3 | 2 | 1 | 0 |
|---|---|---|---|---|---|---|---|---|
| p1 | | | | upper boundary wl<5:0> | | | | |
| p2 | | LP WLSV<7:4> | | | | sub blk<3:0> | | |
| p3 | | | blk address<7:0> | | | | | |
| p4 | loc<1:0> | | | | | | blk add<10:8> | |

Moreover, to address the first issue discussed above, one embodiment stores the partial block number and the last wordline voltage value on the NVM 152 or the NAND die (which may be updated by system firmware or logic such as logic 150 or other logic). When the NAND device receives a read command from the host, it will compare incoming block address to the one stored on the NAND die. If there is a match, the NAND device read algorithm knows that this is a partial block read. In that case, lower Vpassr (referring to voltage on unselected wordline during read sensing) will be applied to the erased WLs based on the "last programmed wordline" information stored in the parameter structure (e.g., Table 1) for the partially written block. With this approach, there is no extra stress on the erased WLs during read and partial block read disturb relocation limit may be relaxed (to match closed band relocation limit). This will result in a performance improvement for read intensive workloads without sacrificing read disturb reliability.

Further, to address the second issue discussed above, an embodiment stores the LP WLSV information (from first LP program) for each partially written block (such as shown in Table 1). This way NAND die is able to determine and apply LP WLSV information for every incoming program/write command even when multiple blocks are programmed in parallel. This embodiment may result in about 10% program time performance improvement.

Figure 2:
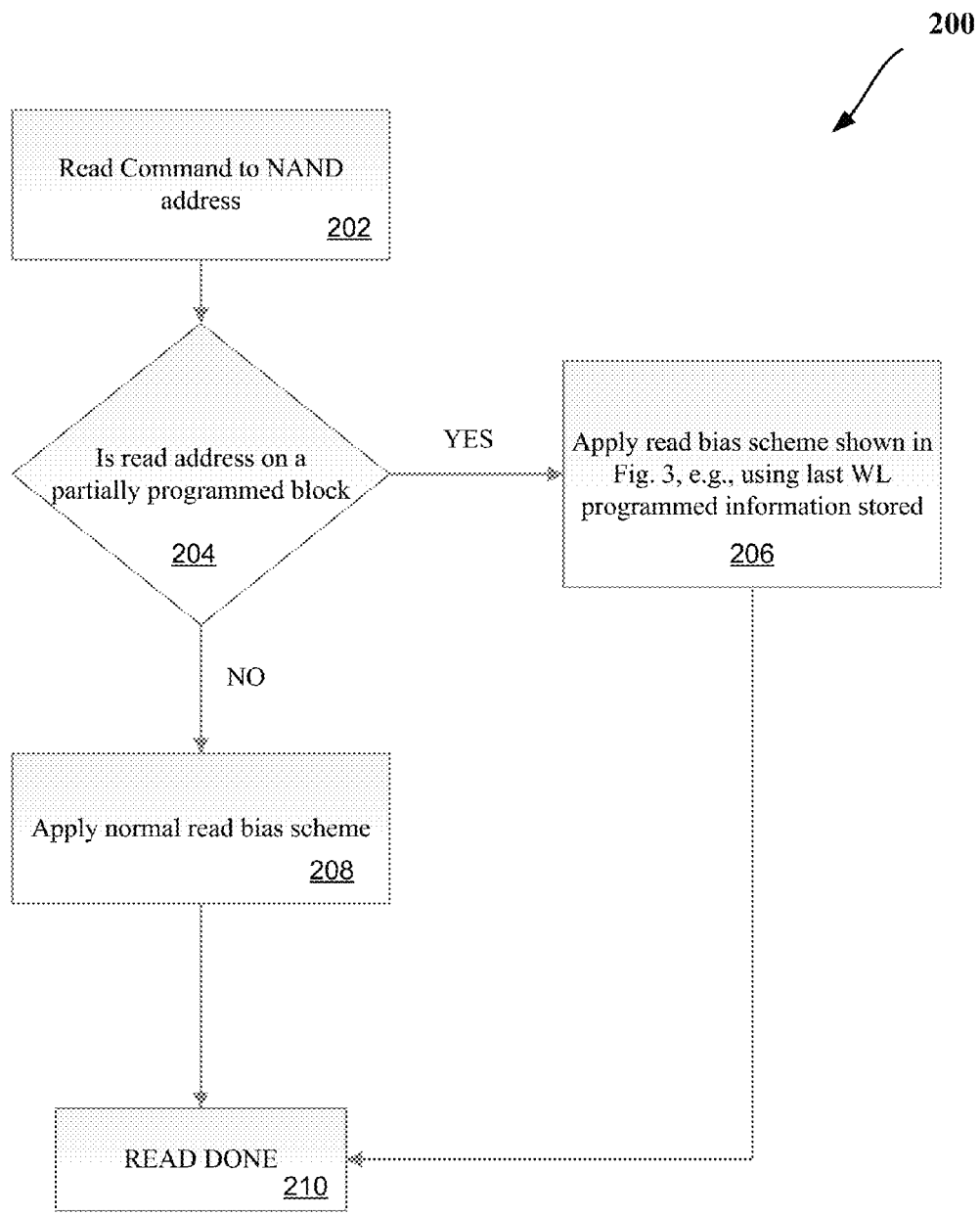
FIGS. 2 and 4 illustrate flow diagrams of methods to improve reliability and/or performance of partially written memory blocks in flash memory systems, in accordance with some embodiments.

FIG. 2 illustrates a flow diagram of a method 200 to perform read operations on partially programmed memory blocks, in accordance with an embodiment. In one embodiment, various components discussed with reference to FIGS. 1 and 3-7 may be utilized to perform one or more of the operations discussed with reference to FIG. 2. In an embodiment, method 200 is implemented in logic (e.g., firmware) such as logic 150 of FIG. 1.

In an embodiment, a NAND component stores the partially programmed block list and also the corresponding information for each block (as described with reference to Table 1). In turn, for read operations from a NAND die, method 300 may be used. Referring to FIGS. 1-2, at an operation 202, a read command to a NAND memory address is detected. An operation 204 determines whether the detected read address corresponds to a partially programmed block (e.g., by accessing a storage structure, such as discussed with reference to Table 1). If the read address corresponds to a partially programmed block, then operation 206 applies a read bias scheme (such as discussed with reference to FIG. 3, e.g., using stored last WL programmed information); otherwise, a normal/regular read bias scheme is applied at operation 208 as discussed above. Method 200 terminates at operation 210 when the read operation is done.

Figure 3:
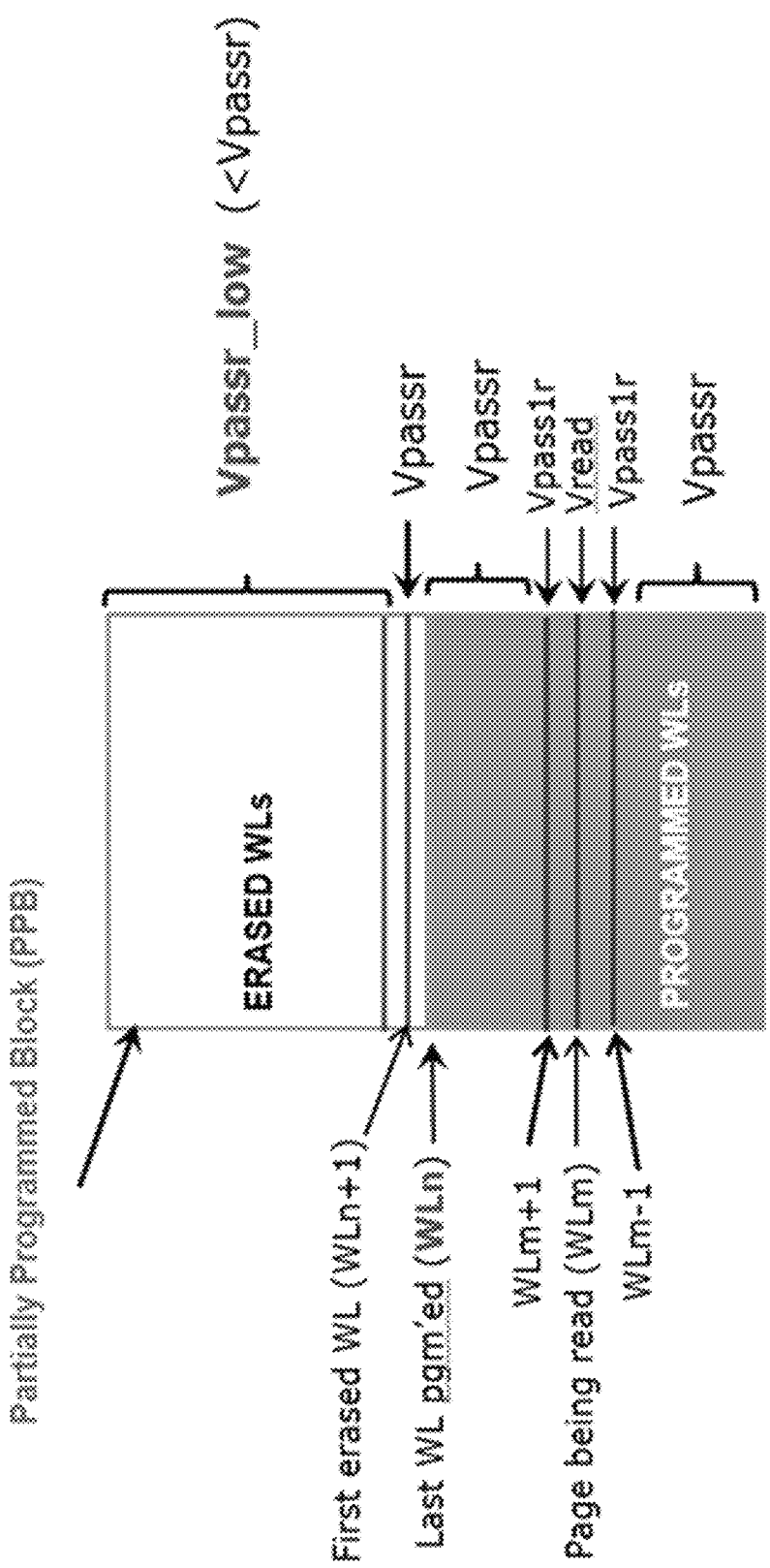
FIG. 3 illustrates a read bias scheme applied to a partially programmed memory block, according to an embodiment.

FIG. 3 shows a read bias scheme applied to a partially programmed memory block, according to an embodiment. Here the last programmed WL (WLn) information is stored on the NAND die (e.g., on NVM 152) for each partial block.

Figure 4:
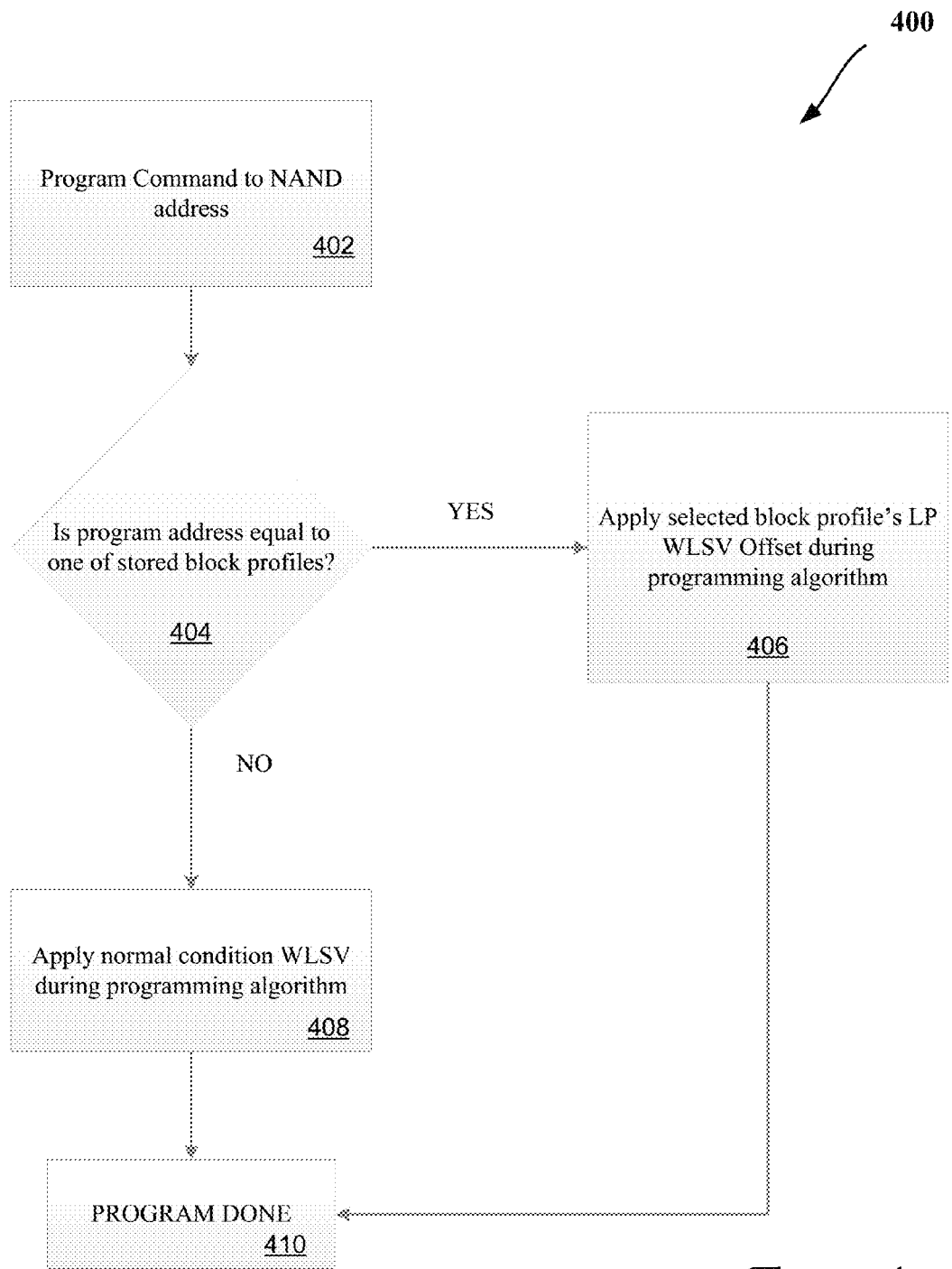

FIG. 4 illustrates a flow diagram of a method 400 to program a NAND die, in accordance with an embodiment. In one embodiment, various components discussed with reference to FIGS. 1-3 and 5-7 may be utilized to perform one or more of the operations discussed with reference to FIG. 4. In an embodiment, method 400 is implemented in logic (e.g., firmware) such as logic 150 of FIG. 1.

For programming a NAND die, method 400 may be used during the LP WLSV feature. In an embodiment, the NAND die (e.g., NVM 152) and/or logic coupled to the NAND die such as logic 150 compares an incoming program block number and then selects the LP program start voltage value from the corresponding matching block number profile stored on the NAND die (e.g., as discussed with reference to Table 1). For instance, for first LP of a Block, logic (e.g., logic 150) selects the default start voltage value. At the end of LP program, logic (e.g., logic 150) stores the start voltage for next consecutive pages in respective block profile.

Referring to FIGS. 1-4, at an operation 402, a program/write command to a flash memory (e.g., a NAND die such as NVM 152) is detected (e.g., by logic 150). An operation 404 determines whether the address associated with the program command of operation 402 matches one of the (e.g., four) stored block profiles. If so, the selected block profile's LP WLSV offset is selected at operation 406; otherwise a normal/regular condition for WLSV is applied during programming at operation 408. Method 400 terminates at operation 410.

Accordingly, techniques discussed herein may be used to provide consistent SSD performance, even for read intensive corner case workloads. Also, some embodiments may provide about 10% write performance improvement.

Figure 5:
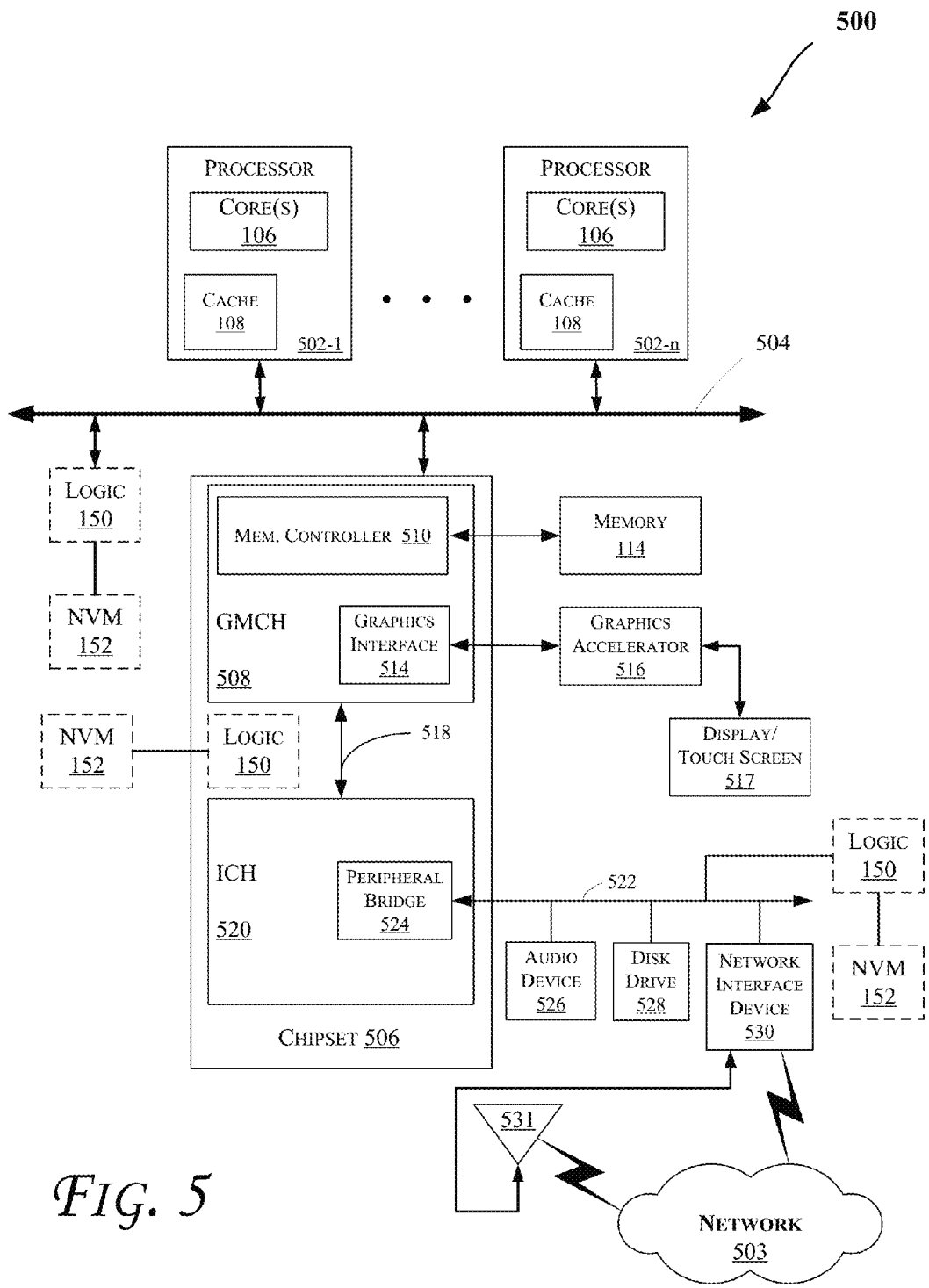

FIG. 5 illustrates a block diagram of a computing system 500 in accordance with an embodiment of the invention. The computing system 500 may include one or more central processing unit(s) (CPUs) 502 or processors that communicate via an interconnection network (or bus) 504. The processors 502 may include a general purpose processor, a network processor (that processes data communicated over a computer network 503), an application processor (such as those used in cell phones, smart phones, etc.), or other types of a processor (including a reduced instruction set computer (RISC) processor or a complex instruction set computer (CISC)). Various types of computer networks 503 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 5G, Low Power Embedded (LPE), etc.). Moreover, the processors 502 may have a single or multiple core design. The processors 502 with a multiple core design may integrate different types of processor cores on the same integrated circuit (IC) die. Also, the processors 502 with a multiple core design may be implemented as symmetrical or asymmetrical multiprocessors.

In an embodiment, one or more of the processors 502 may be the same or similar to the processors 102 of FIG. 1. For example, one or more of the processors 502 may include one or more of the cores 106 and/or cache 108. Also, the operations discussed with reference to FIGS. 1-4 may be performed by one or more components of the system 500.

A chipset 506 may also communicate with the interconnection network 504. The chipset 506 may include a graphics and memory control hub (GMCH) 508. The GMCH 508 may include a memory controller 510 (which may be the same or similar to the memory controller 120 of FIG. 1 in an embodiment) that communicates with the memory 114. System 500 may also include logic 150 (e.g., coupled to NVM 152) in various locations (such as those shown in FIG. 5 but can be in other locations within system 500 (not shown)). The memory 114 may store data, including sequences of instructions that are executed by the CPU 502, or any other device included in the computing system 500. In one embodiment of the invention, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk, flash, 3D Cross Point Memory (such as PCM), Resistive Random Access Memory, NAND memory, NOR memory and STTRAM. Additional devices may communicate via the interconnection network 504, such as multiple CPUs and/or multiple system memories.

The GMCH 508 may also include a graphics interface 514 that communicates with a graphics accelerator 516. In one embodiment of the invention, the graphics interface 514 may communicate with the graphics accelerator 516 via an accelerated graphics port (AGP) or Peripheral Component Interconnect (PCI) (or PCI express (PCIe) interface). In an embodiment of the invention, a display 517 (such as a flat panel display, touch screen, etc.) may communicate with the graphics interface 514 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 517.

A hub interface 518 may allow the GMCH 508 and an input/output control hub (ICH) 520 to communicate. The ICH 520 may provide an interface to I/O devices that communicate with the computing system 500. The ICH 520 may communicate with a bus 522 through a peripheral bridge (or controller) 524, such as a peripheral component interconnect (PCI) bridge, a universal serial bus (USB) controller, or other types of peripheral bridges or controllers. The bridge 524 may provide a data path between the CPU 502 and peripheral devices. Other types of topologies may be utilized. Also, multiple buses may communicate with the ICH 520, e.g., through multiple bridges or controllers. Moreover, other peripherals in communication with the ICH 520 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 522 may communicate with an audio device 526, one or more disk drive(s) 528, and a network interface device 530 (which is in communication with the computer network 503, e.g., via a wired or wireless interface). As shown, the network interface device 530 may be coupled to an antenna 531 to wirelessly (e.g., via an Institute of Electrical and Electronics Engineers (IEEE) 802.11 interface (including IEEE 802.11a/b/g/n, etc.), cellular interface, 3G, 5G, LPE, etc.) communicate with the network 503. Other devices may communicate via the bus 522. Also, various components (such as the network interface device 530) may communicate with the GMCH 508 in some embodiments. In addition, the processor 502 and the GMCH 508 may be combined to form a single chip. Furthermore, the graphics accelerator 516 may be included within the GMCH 508 in other embodiments.

Furthermore, the computing system 500 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 528), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 6:
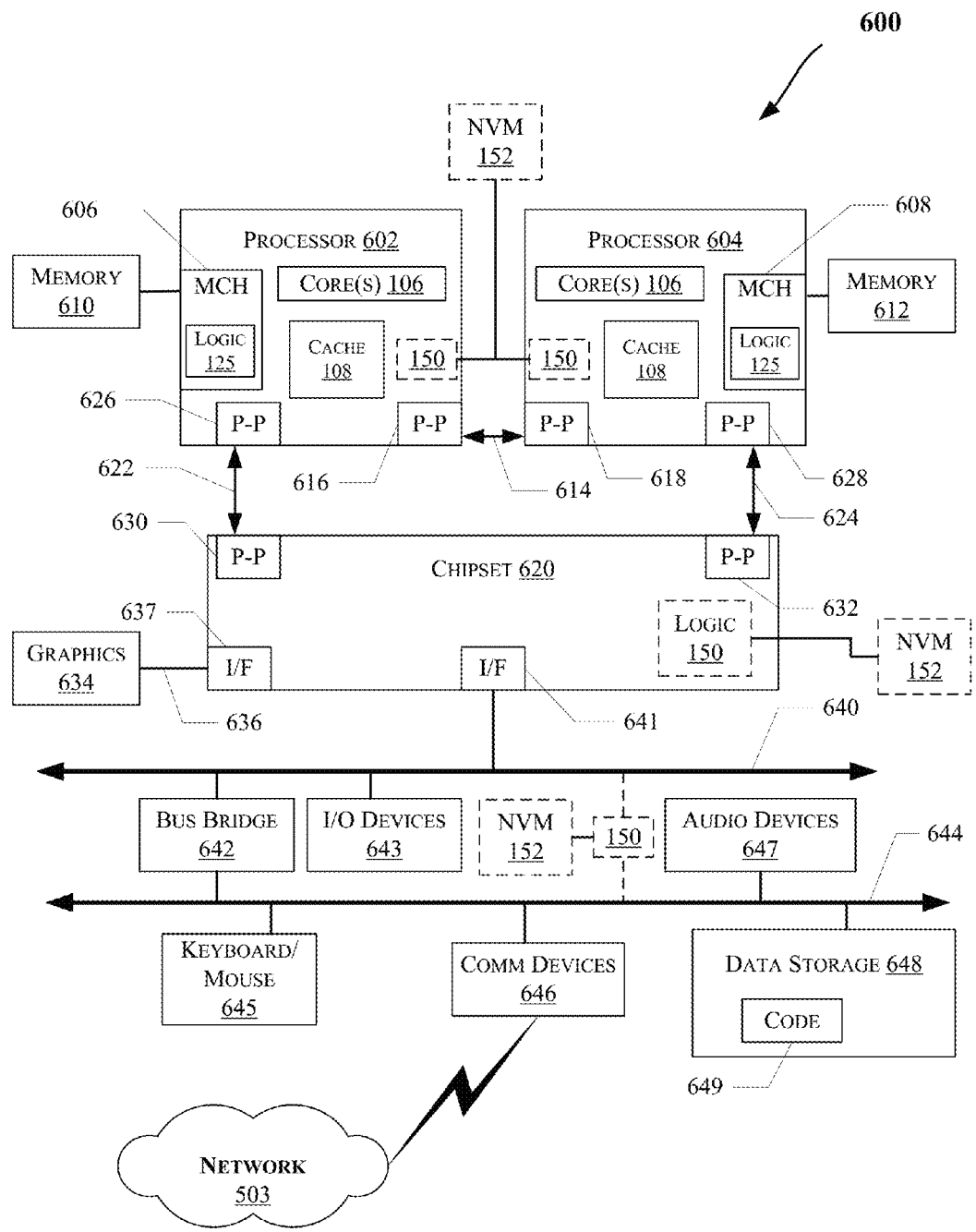

FIG. 6 illustrates a computing system 600 that is arranged in a point-to-point (PtP) configuration, according to an embodiment. In particular, FIG. 6 shows a system where processors, memory, and input/output devices are interconnected by a number of point-to-point interfaces. The operations discussed with reference to FIGS. 1-5 may be performed by one or more components of the system 600.

As illustrated in FIG. 6, the system 600 may include several processors, of which only two, processors 602 and 604 are shown for clarity. The processors 602 and 604 may each include a local memory controller hub (MCH) 606 and 608 to enable communication with memories 610 and 612. The memories 610 and/or 612 may store various data such as those discussed with reference to the memory 114 or NVM 152 of FIGS. 1 and/or 5. Also, MCH 606 and 608 may include the memory controller 120 and/or logic 150 of FIG. 1 in some embodiments.

In an embodiment, the processors 602 and 604 may be one of the processors 502 discussed with reference to FIG. 5. The processors 602 and 604 may exchange data via a point-to-point (PtP) interface 614 using PtP interface circuits 616 and 618, respectively. Also, the processors 602 and 604 may each exchange data with a chipset 620 via individual PtP interfaces 622 and 624 using point-to-point interface circuits 626, 628, 630, and 632. The chipset 620 may further exchange data with a high-performance graphics circuit 634 via a high-performance graphics interface 636, e.g., using a PtP interface circuit 637. As discussed with reference to FIG. 5, the graphics interface 636 may be coupled to a display device (e.g., display 517) in some embodiments.

As shown in FIG. 6, one or more of the cores 106 and/or cache 108 of FIG. 1 may be located within the processors 602 and 604. Other embodiments, however, may exist in other circuits, logic units, or devices within the system 600 of FIG. 6. Furthermore, other embodiments may be distributed throughout several circuits, logic units, or devices illustrated in FIG. 6.

The chipset 620 may communicate with a bus 640 using a PtP interface circuit 641. The bus 640 may have one or more devices that communicate with it, such as a bus bridge 642 and I/O devices 643. Via a bus 644, the bus bridge 642 may communicate with other devices such as a keyboard/mouse 645, communication devices 646 (such as modems, network interface devices, or other communication devices that may communicate with the computer network 503, as discussed with reference to network interface device 530 for example, including via antenna 531), audio I/O device, and/or a data storage device 648. The data storage device 648 may store code 649 that may be executed by the processors 602 and/or 604.

Figure 7:
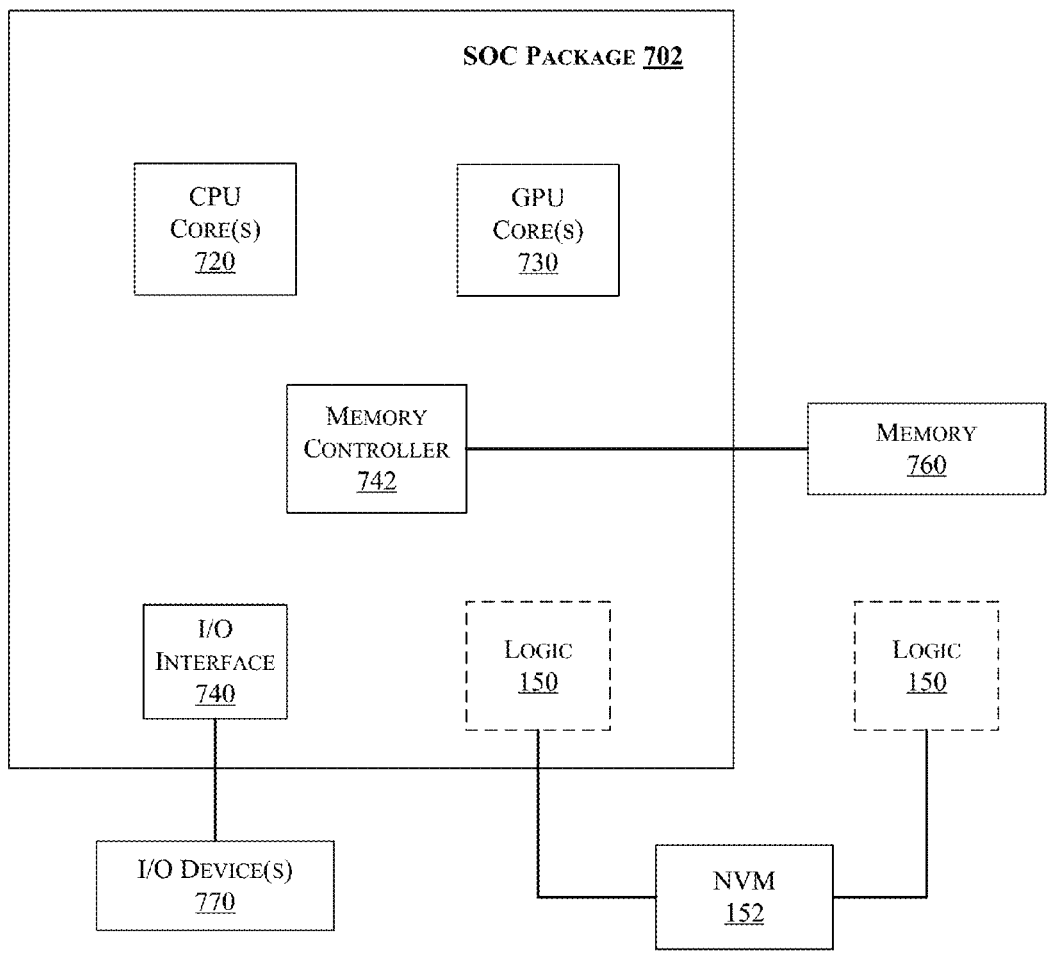

In some embodiments, one or more of the components discussed herein can be embodied as a System On Chip (SOC) device. FIG. 7 illustrates a block diagram of an SOC package in accordance with an embodiment. As illustrated in FIG. 7, SOC 702 includes one or more Central Processing Unit (CPU) cores 720, one or more Graphics Processor Unit (GPU) cores 730, an Input/Output (I/O) interface 740, and a memory controller 742. Various components of the SOC package 702 may be coupled to an interconnect or bus such as discussed herein with reference to the other figures. Also, the SOC package 702 may include more or less components, such as those discussed herein with reference to the other figures. Further, each component of the SOC package 720 may include one or more other components, e.g., as discussed with reference to the other figures herein. In one embodiment, SOC package 702 (and its components) is provided on one or more Integrated Circuit (IC) die, e.g., which are packaged onto a single semiconductor device.

As illustrated in FIG. 7, SOC package 702 is coupled to a memory 760 (which may be similar to or the same as memory discussed herein with reference to the other figures) via the memory controller 742. In an embodiment, the memory 760 (or a portion of it) can be integrated on the SOC package 702.

The I/O interface 740 may be coupled to one or more I/O devices 770, e.g., via an interconnect and/or bus such as discussed herein with reference to other figures. I/O device(s) 770 may include one or more of a keyboard, a mouse, a touchpad, a display, an image/video capture device (such as a camera or camcorder/video recorder), a touch screen, a speaker, or the like. Furthermore, SOC package 702 may include/integrate the logic 150 in an embodiment. Alternatively, the logic 150 may be provided outside of the SOC package 702 (i.e., as a discrete logic).

The following examples pertain to further embodiments. Example 1 includes an apparatus comprising: a storage device to store a partial block number and a last wordline voltage value corresponding to a partial write operation performed on a partially programmed memory block of a non-volatile memory; and memory controller logic, coupled to the non-volatile memory, to cause application of a reduced voltage level to erased wordlines of the non-volatile memory during a read operation to the non-volatile memory based at least in part on the partial block number and the last wordline voltage value. Example 2 includes the apparatus of example 1, wherein the non-volatile memory is to comprise the storage device. Example 3 includes the apparatus of example 1, wherein the memory controller logic is to cause application of the reduced voltage level to the erased wordlines of the non-volatile memory during the read operation to the non-volatile memory in response to a determination that the read operation is directed at the partially programmed memory block. Example 4 includes the apparatus of example 1, wherein the memory controller logic or system firmware is to update the partial block number and the last wordline voltage value. Example 5 includes the apparatus of example 1, wherein the non-volatile memory is to comprise a NAND non-volatile memory or a NOR non-volatile memory. Example 6 includes the apparatus of example 1, wherein one or more processor cores are coupled to the memory controller logic to access data stored in the non-volatile memory.

Example 7 includes an apparatus comprising: a storage device to store data corresponding to a Lower Page (LP) Word Line Start Voltage (WLSV) programming of a partial write operation performed on a partially programmed memory block of a non-volatile memory; and memory controller logic, coupled to the non-volatile memory, to cause application of an LP WLSV offset value during a write operation to the non-volatile memory based at least in part on the data stored in the storage device. Example 8 includes the apparatus of example 7, wherein the stored data is to comprise an LP WLSV loop count. Example 9 includes the apparatus of example 7, wherein the non-volatile memory is to comprise the storage device. Example 10 includes the apparatus of example 7, wherein the memory controller logic is to cause application of the LP WLSV offset value during the write operation to the non-volatile memory in response to a determination that the write operation is directed at the partially programmed memory block. Example 11 includes the apparatus of example 7, wherein the non-volatile memory is to comprise a NAND non-volatile memory or a NOR non-volatile memory. Example 12 includes the apparatus of example 7, wherein one or more processor cores are coupled to the memory controller logic to access data stored in the non-volatile memory.

Example 13 includes a computer-readable medium comprising one or more instructions that when executed on a processor configure the processor to perform one or more operations to: store, in a storage device, a partial block number and a last wordline voltage value corresponding to a partial write operation performed on a partially programmed memory block of a non-volatile memory; and cause, at memory controller logic, application of a reduced voltage level to erased wordlines of the non-volatile memory during a read operation to the non-volatile memory based at least in part on the partial block number and the last wordline voltage value. Example 14 includes the computer-readable medium of example 13, wherein the non-volatile memory is to comprise the storage device. Example 15 includes the computer-readable medium of example 13, further comprising one or more instructions that when executed on the processor configure the processor to perform one or more operations to cause the memory controller logic to cause application of the reduced voltage level to the erased wordlines of the non-volatile memory during the read operation to the non-volatile memory in response to a determination that the read operation is directed at the partially programmed memory block. Example 16 includes the computer-readable medium of example 13, further comprising one or more instructions that when executed on the processor configure the processor to perform one or more operations to cause the memory controller logic or system firmware to update the partial block number and the last wordline voltage value. Example 17 includes the computer-readable medium of example 13, wherein the non-volatile memory is to comprise a NAND non-volatile memory or a NOR non-volatile memory. Example 18 includes the computer-readable medium of example 13, wherein the processor comprises one or more processor cores coupled to the memory controller logic to access data stored in the non-volatile memory.

Example 19 includes a computer-readable medium comprising one or more instructions that when executed on a processor configure the processor to perform one or more operations to: store in a storage device data corresponding to a Lower Page (LP) Word Line Start Voltage (WLSV) programming of a partial write operation performed on a partially programmed memory block of a non-volatile memory; and cause, at memory controller logic, application of an LP WLSV offset value during a write operation to the non-volatile memory based at least in part on the data stored in the storage device. Example 20 includes the computer-readable medium of example 19, wherein the stored data is to comprise an LP WLSV loop count. Example 21 includes the computer-readable medium of example 19, wherein the non-volatile memory is to comprise the storage device. Example 22 includes the computer-readable medium of example 19, further comprising one or more instructions that when executed on the processor configure the processor to perform one or more operations to cause the memory controller logic to cause application of the LP WLSV offset value during the write operation to the non-volatile memory in response to a determination that the write operation is directed at the partially programmed memory block.

Example 23 includes the computer-readable medium of example 19, wherein the non-volatile memory is to comprise a NAND non-volatile memory or a NOR non-volatile memory. Example 24 includes the computer-readable medium of example 19, wherein the processor comprises one or more processor cores coupled to the memory controller logic to access data stored in the non-volatile memory.

Example 25 includes a method comprising: storing, in a storage device, a partial block number and a last wordline voltage value corresponding to a partial write operation performed on a partially programmed memory block of a non-volatile memory; and causing, at memory controller logic, application of a reduced voltage level to erased wordlines of the non-volatile memory during a read operation to the non-volatile memory based at least in part on the partial block number and the last wordline voltage value. Example 26 includes the method of example 25, wherein the non-volatile memory comprises the storage device. Example 27 includes the method of example 25, further comprising causing application of the reduced voltage level to the erased wordlines of the non-volatile memory during the read operation to the non-volatile memory in response to a determination that the read operation is directed at the partially programmed memory block. Example 28 includes the method of example 25, further comprising causing the memory controller logic or system firmware to update the partial block number and the last wordline voltage value. Example 29 includes the method of example 25, wherein the non-volatile memory comprises a NAND non-volatile memory or a NOR non-volatile memory. Example 30 includes the method of example 25, wherein the processor comprises one or more processor cores coupled to the memory controller logic to access data stored in the non-volatile memory.

Example 31 includes a method comprising: storing in a storage device data corresponding to a Lower Page (LP) Word Line Start Voltage (WLSV) programming of a partial write operation performed on a partially programmed memory block of a non-volatile memory; and causing, at memory controller logic, application of an LP WLSV offset value during a write operation to the non-volatile memory based at least in part on the data stored in the storage device. Example 32 includes the method of example 31, wherein the stored data comprises an LP WLSV loop count. Example 33 includes the method of example 31, wherein the non-volatile memory comprises the storage device. Example 34 includes the method of example 31, further comprising causing the memory controller logic to cause application of the LP WLSV offset value during the write operation to the non-volatile memory in response to a determination that the write operation is directed at the partially programmed memory block. Example 35 includes the method of example 31, wherein the non-volatile memory comprises a NAND non-volatile memory or a NOR non-volatile memory. Example 36 includes the method of example 31, wherein the processor comprises one or more processor cores coupled to the memory controller logic to access data stored in the non-volatile memory.

Example 37 includes an apparatus comprising means to perform a method as set forth in any preceding example.

Example 38 includes a machine-readable storage including machine-readable instructions, when executed, to implement a method or realize an apparatus as set forth in any preceding example.

Example 39 includes a system comprising: a processor; a storage device, coupled to the processor, to store a partial block number and a last wordline voltage value corresponding to a partial write operation performed on a partially programmed memory block of a non-volatile memory; and memory controller logic, coupled to the non-volatile memory, to cause application of a reduced voltage level to erased wordlines of the non-volatile memory during a read operation to the non-volatile memory based at least in part on the partial block number and the last wordline voltage value. Example 40 includes the system of example 39, wherein the non-volatile memory is to comprise the storage device. Example 41 includes the system of example 39, wherein the memory controller logic is to cause application of the reduced voltage level to the erased wordlines of the non-volatile memory during the read operation to the non-volatile memory in response to a determination that the read operation is directed at the partially programmed memory block. Example 42 includes the system of example 39, wherein the memory controller logic or system firmware is to update the partial block number and the last wordline voltage value. Example 43 includes the system of example 39, wherein the non-volatile memory is to comprise a NAND non-volatile memory or a NOR non-volatile memory. Example 44 includes the system of example 39, wherein one or more processor cores of the processor are coupled to the memory controller logic to access data stored in the non-volatile memory.

Example 45 includes a system comprising: a processor; a storage device, coupled to the processor, to store data corresponding to a Lower Page (LP) Word Line Start Voltage (WLSV) programming of a partial write operation performed on a partially programmed memory block of a non-volatile memory; and memory controller logic, coupled to the non-volatile memory, to cause application of an LP WLSV offset value during a write operation to the non-volatile memory based at least in part on the data stored in the storage device. Example 46 includes the system of example 45, wherein the stored data is to comprise an LP WLSV loop count. Example 47 includes the system of example 45, wherein the non-volatile memory is to comprise the storage device. Example 48 includes the system of example 45, wherein the memory controller logic is to cause application of the LP WLSV offset value during the write operation to the non-volatile memory in response to a determination that the write operation is directed at the partially programmed memory block. Example 49 includes the system of example 45, wherein the non-volatile memory is to comprise a NAND non-volatile memory or a NOR non-volatile memory. Example 50 includes the system of example 45, wherein one or more processor cores of the processor are coupled to the memory controller logic to access data stored in the non-volatile memory.

In various embodiments, the operations discussed herein, e.g., with reference to FIGS. 1-7, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-7.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
a storage device to store data corresponding to a Lower Page (LP) Word Line Start Voltage (WLSV) programming of a partial write operation performed on a partially programmed memory block of a non-volatile memory; and
memory controller logic, coupled to the non-volatile memory, to cause application of an LP WLSV offset value during a write operation to the non-volatile memory based at least in part on the data stored in the storage device.

2. The apparatus of claim 1, wherein the stored data is to comprise an LP WLSV loop count.

3. The apparatus of claim 1, wherein the non-volatile memory is to comprise the storage device.

4. The apparatus of claim 1, wherein the memory controller logic is to cause application of the LP WLSV offset value during the write operation to the non-volatile memory in response to a determination that the write operation is directed at the partially programmed memory block.

5. The apparatus of claim 1, wherein the non-volatile memory is to comprise a NAND non-volatile memory or a NOR non-volatile memory.

6. The apparatus of claim 1, wherein one or more processor cores are to be coupled to the memory controller logic to access data stored in the non-volatile memory.

7. One or more computer-readable medium comprising one or more instructions that when executed on a processor configure the processor to perform one or more operations to:
store in a storage device data corresponding to a Lower Page (LP) Word Line Start Voltage (WLSV) programming of a partial write operation performed on a partially programmed memory block of a non-volatile memory; and
cause, at memory controller logic, application of an LP WLSV offset value during a write operation to the non-volatile memory based at least in part on the data stored in the storage device.

8. The computer-readable medium of claim 7, wherein the stored data is to comprise an LP WLSV loop count.

9. The computer-readable medium of claim 7, wherein the non-volatile memory is to comprise the storage device.

10. The computer-readable medium of claim 7, further comprising one or more instructions that when executed on the processor configure the processor to perform one or more operations to cause the memory controller logic to cause application of the LP WLSV offset value during the write operation to the non-volatile memory in response to a determination that the write operation is directed at the partially programmed memory block.

11. The computer-readable medium of claim 7, wherein the non-volatile memory is to comprise a NAND non-volatile memory or a NOR non-volatile memory.

12. The computer-readable medium of claim 7, wherein the processor comprises one or more processor cores coupled to the memory controller logic to access data stored in the non-volatile memory.

13. A computing system comprising:
a processor having one or more processor cores;
a storage device, coupled to the processor, to store data corresponding to a Lower Page (LP) Word Line Start Voltage (WLSV) programming of a partial write operation performed on a partially programmed memory block of a non-volatile memory; and
memory controller logic, coupled to the non-volatile memory, to cause application of an LP WLSV offset value during a write operation to the non-volatile memory based at least in part on the data stored in the storage device.

14. The system of claim 13, wherein the stored data is to comprise an LP WLSV loop count.

15. The system of claim 13, wherein the non-volatile memory is to comprise the storage device.

16. The system of claim 13, wherein the memory controller logic is to cause application of the LP WLSV offset value during the write operation to the non-volatile memory in response to a determination that the write operation is directed at the partially programmed memory block.

17. The system of claim 13, wherein the non-volatile memory is to comprise a NAND non-volatile memory or a NOR non-volatile memory.

18. The system of claim 13, wherein the one or more processor cores are to be coupled to the memory controller logic to access data stored in the non-volatile memory.

19. The system of claim 13, further comprising a battery coupled to the processor.

20. The system of claim 13, further comprising one or more of a network interface to communicate data with the processor or a display.

* * * * *